United States Patent [19]

Crawford et al.

[11] Patent Number: 5,525,906
[45] Date of Patent: Jun. 11, 1996

[54] DETECTION AND ELIMINATION OF WIDE BANDWIDTH NOISE IN MRI SIGNALS

[75] Inventors: Carl R. Crawford, Milwaukee; Matthew G. Eash, Oconomowoc, both of Wis.; Steven P. Souza, Williamstown, Mass.; Norbert J. Pelc, Los Altos, Calif.; Dennis G. DallaPiazza, Pewaukee, Wis.; Daniel S. Small, Hartland, Wis.; Robert S. Stormont, Waukesha, Wis.

[73] Assignee: General Electric, Waukesha, Wis.

[21] Appl. No.: 273,577

[22] Filed: Jul. 11, 1994

[51] Int. Cl.$^6$ ................................ G01R 33/28
[52] U.S. Cl. ........................... 324/322; 324/318
[58] Field of Search ................ 324/322, 318, 324/309, 307, 300, 314, 316; 128/653.5

[56] References Cited

U.S. PATENT DOCUMENTS

| | | | |
|---|---|---|---|
| 5,038,785 | 8/1991 | Blakeley et al. | 128/653.5 |
| 5,317,265 | 5/1994 | Weinstock | 324/318 |
| 5,323,776 | 6/1994 | Blakeley et al. | 128/653.2 |
| 5,374,895 | 12/1994 | Lee et al. | 324/322 |
| 5,384,537 | 1/1995 | Ito et al. | 324/318 |
| 5,427,102 | 6/1995 | Shimode et al. | 324/318 |
| 5,436,564 | 7/1995 | Kreger et al. | 324/322 |

FOREIGN PATENT DOCUMENTS 3-76138  3/1990  Japan.

OTHER PUBLICATIONS

*Suppression of Internal Noise Induced by the Vibration of a Cylindrical Shell*, 1993 JSME Proceedings of the 1993 International Conference on Advanced Mechatronics, Tokyo Japan.
*Extraction of Noise Spikes in MR Imaging*, MJSanz, EMHaacke, Proceedings of Society of Magnetic Resonance Imaging, JMRI, vol. 2P, p. 789, 1992.
*Spike Removal from MR Raw Data Sets*, T. Spraggins, Proceedings of SMRM, p. 789, 1987.
*Investigation into the Effects of Static Electrical Discharge on MR Images*, Radiology, 161 P, p. 245, 1986.
*Echo Shape Analysis and Image Size Adjustment on the Level of Echoes: Improvement of Parameter–Selective Proton Images*, M. Staemmler & K. Gersonde, MRM 3, 418–424 (1986).
*Fundamental Limitations In The Measurement of Corona and Partial Discharge*, SABoggs & GCStone, IEEE Transaction on Electrical Insulation vol. El–17, No. 2, pp. 143–150, Apr. 1992.

*Primary Examiner*—Walter E. Snow
*Assistant Examiner*—Raymond Y. Mah
*Attorney, Agent, or Firm*—Quarles & Brady

[57] ABSTRACT

An MRI system includes a noise filter which receives each acquired NMR signal during a scan and detects short-duration noise pulses by sensing the signal level in a band of frequencies outside the imaging bandwidth. A blanking circuit suppresses the NMR signal during the time interval each noise pulse is detected to remove the noise pulse prior to image reconstruction.

5 Claims, 2 Drawing Sheets

5,525,906

DETECTION AND ELIMINATION OF WIDE BANDWIDTH NOISE IN MRI SIGNALS

BACKGROUND OF THE INVENTION

The field of the invention is nuclear magnetic resonance imaging methods and systems. More particularly, the invention relates to the detection of wide bandwidth noise in NMR signals acquired during a scan and the elimination of artifacts produced by such noise in the reconstructed image.

When a substance such as human tissue is subjected to a uniform magnetic field (polarizing field $b_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A radio-frequency (RF), which is also denoted the NMR signal is emitted by the excited spins after the excitation signal $B_1$ is terminated and this signal may be received and processed to form an image.

This "NMR" signal is very small and extraordinary measures are taken to shield the MRI system from external RF noise and to eliminate sources of internal noise. Nevertheless, generators of short-duration noise pulses persist and may elude location and elimination. These noise pulses are referred to as "spike noise", "impulse noise" or "white pixels", and lead to image artifacts with such vernacular names as corduroy and zebra artifacts. Sources of such noise include arcing due to partial discharges from intermittent electrical contacts or electrostatic discharge, and harmonics of fast transients such as those caused by ground loops. When such noise sources occur regularly, their source can be located and measures can be taken to eliminate them. This "hardening" process occurs at any new MRI installation, and eventually all the short-duration noise sources are eliminated except those which are intermittent and defy cost-effective diagnosis.

A number of strategies have been employed to mitigate the effects of intermittent noise sources. Such methods include the examination of the acquired NMR signals to locate noise spikes or the examination of the reconstructed image to locate the effects of such noise. These prior methods work when the noise spike occurs in NMR signals that are heavily phase or frequency encoded (i.e. on the edges of k-space), but they do not perform well when the noise spike occurs in NMR signals near the center of k-space. In the latter case the NMR signal magnitude is quite large and it is more difficult to discern signal from noise. Noise spikes detected by such methods are typically removed by interpolating between the adjacent values.

SUMMARY OF THE INVENTION

The present invention relates to the detection of short-duration noise in NMR signals and the removal of such noise from the NMR image data set. More specifically, the present invention includes a bandpass filter connected to receive the NMR signal and tuned to pass a range of frequencies outside the NMR imaging frequency band; a detector connected to receive the signal output by the bandpass filter and compare its magnitude with that of a noise reference level and produce a noise indication signal when its magnitude exceeds that of the noise reference level; and means for receiving the noise indication signal and employing it to modify the NMR signal. Short-duration noise spikes have a very broad bandwidth and it is a discovery of the present invention that a considerable portion of their energy outside the NMR imaging signal bandwidth passes through the intrinsic filtering of the receive coils and the relatively narrow bandwidth of the preamplifiers. The bandpass filter passes a significant portion of this noise energy and thus separates it from the NMR imaging signal which is blocked. The broad bandwidth of the short-duration noise source is thus used to detect its presence.

A general object of the invention is to reliably detect the presence of short-duration noise spikes in an acquired NMR signal. The noise is detected regardless of the NMR imaging signal magnitude, thus enabling detection of noise in NMR signals near the center of k-space as well as NMR signals near the edge of k-space.

Another aspect of the invention is the correction of an NMR signal containing a short-duration noise spike. More specifically, a blanking circuit is connected to receive the NMR signal and in response to the noise indication signal, it blocks conveyance of the NMR signal to an image reconstructor. The NMR signal is delayed by an amount comparable to the delay imposed by the bandpass filter such that the short duration noise spike is removed by the operation of the blanking circuit.

Another general object of the invention is to remove short-duration noise spikes from an NMR signal without producing objectionable image artifacts. It has been discovered that simple blanking, or switching off, of the NMR signal during the detected noise effectively removes the image artifacts produced by the noise without creating other objectionable image artifacts.

DESCRIPTION OF THE PREFERRED EMBODIMENT

Figure 1:
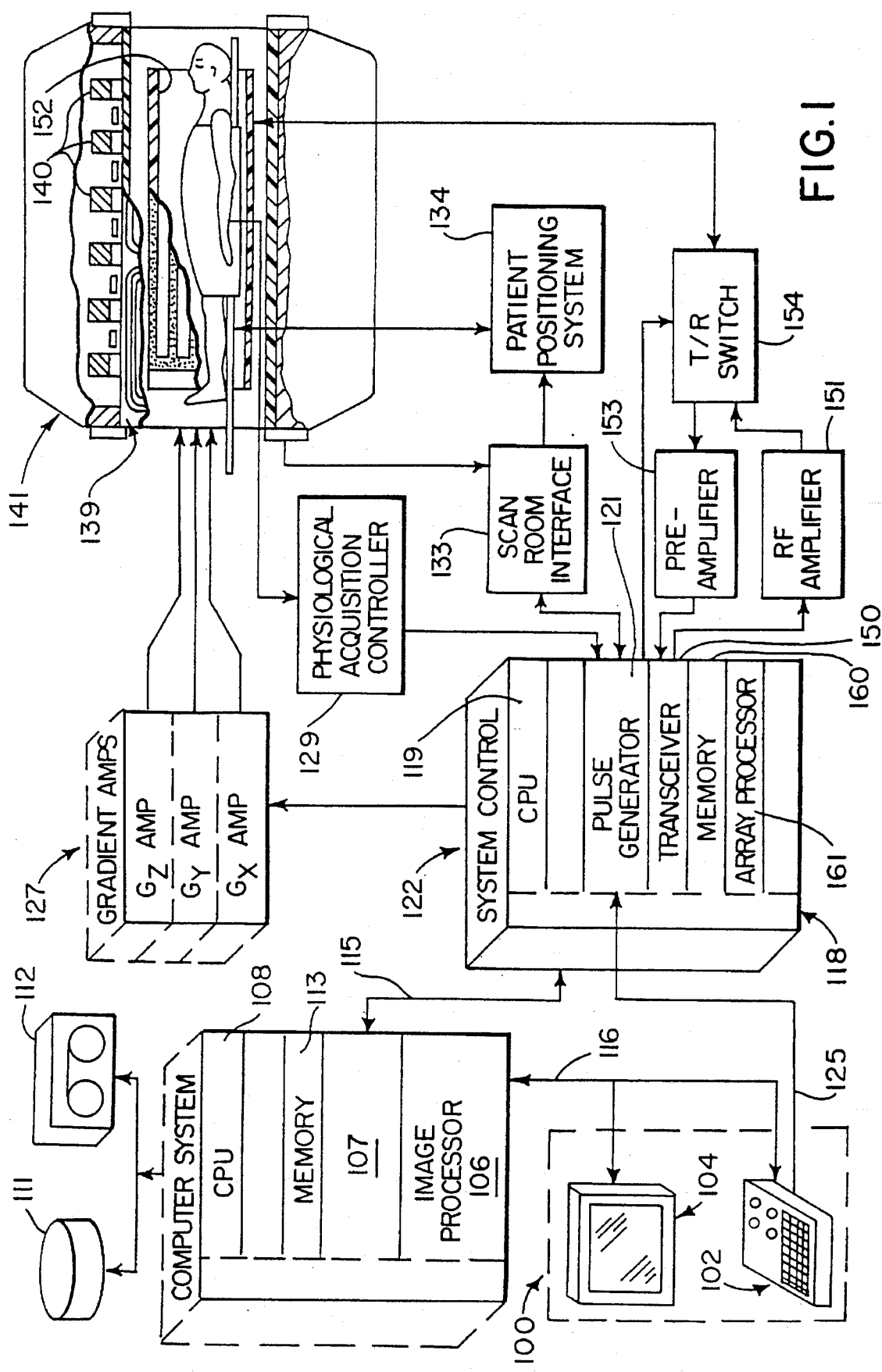
FIG. 1 is a block diagram of an MRI system which employs the present invention.

Referring first to FIG. 1, there is shown the major components of a preferred MRI system that incorporate the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
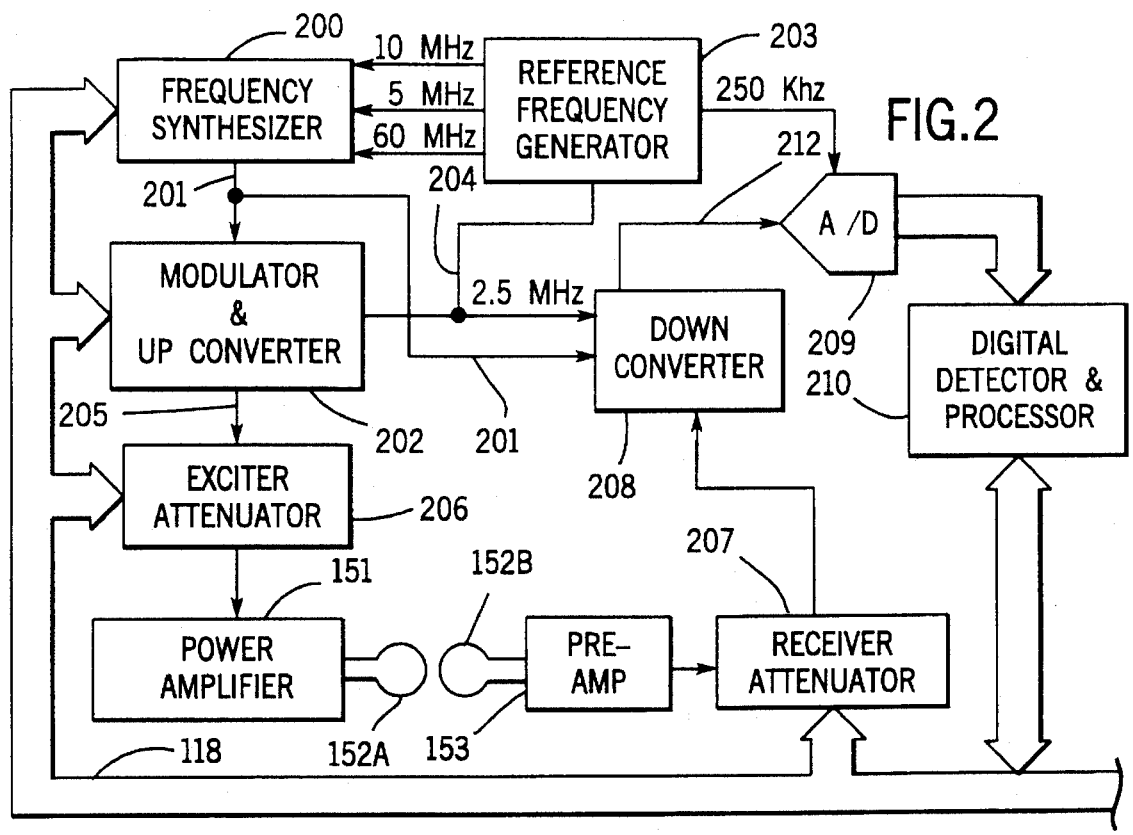
FIG. 2 is an electrical block diagram of the transceiver which forms part of the MRI system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200, which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal also received from the pulse generator module 121. This signal defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. This NMR signal typically occupies a bandwidth less than one megahertz, centered on the Larmor frequency of the spin species being imaged. In a 1.5 Tesla system imaging hydrogen, for example, the Larmor frequency is 63.86 MHz. The receiver attenuator 207 further modifies the amplitude of this NMR signal by an amount determined by a digital attenuation signal (RA) received from the backplane 118. In addition, the receiver attenuator 207 includes a noise filter which practices the present invention and which will be described in detail below with reference to FIGS. 3 and 4.

The received NMR signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal. The digitized samples are applied to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
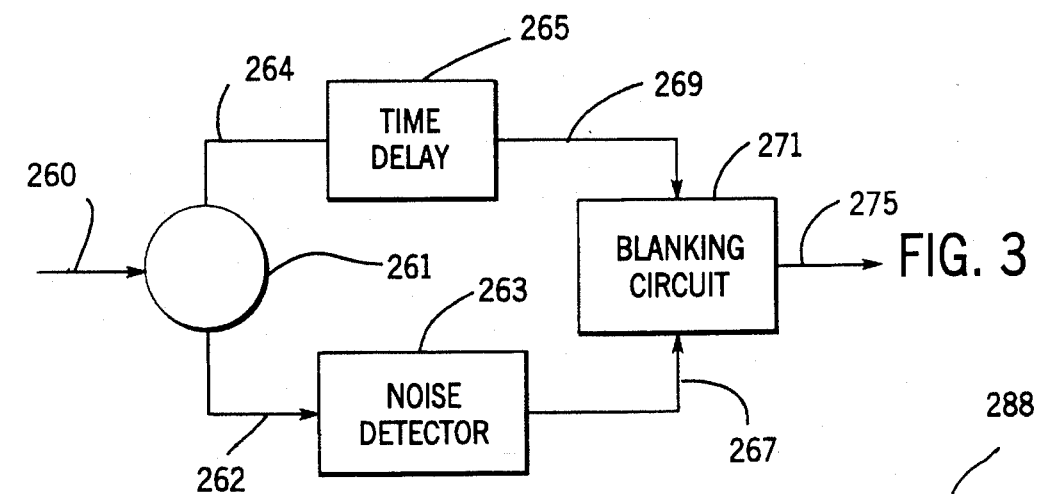
FIG. 3 is an electrical block diagram of the preferred embodiment of the noise filter according to the present invention which forms part of the transceiver of FIG. 2.

Referring particularly to FIG. 3, the preferred embodiment of the noise filter according to the present invention receives the acquired NMR signal at an input 260 from the pre-amp 153. The NMR signal is split at 261 and is applied through line 262 to a noise detector 263 and through a line 264 to a time delay circuit 265. As will be explained in more detail below, the noise detector 263 senses the presence of any short-duration noise spikes in the NMR signal and produces a noise indication signal on line 267. The noise indication signal has a duration which is coincident with the short-duration noise spike, and is typically in the range of 500 nanoseconds. The time delay 265 imposes a delay on the applied NMR signal such that the delayed NMR signal produced on its output 269 coincides with the delay imposed by the noise detector 263. While a conventional time delay circuit may be used for this purpose, in the preferred embodiment a bandpass filter tuned to the Larmor frequency is employed. This filter has a one megahertz bandwidth which is sufficient to pass the NMR imaging frequencies with the desired time delay, and at the same time filter out other frequencies above and below the imaging frequency band.

Referring still to FIG. 3, both the time delayed NMR signal and the noise indicating signal are applied to a blanking circuit 271. The blanking circuit 271 is a gallium-arsenide semiconductor switch which is turned off by the noise indicating signal on line 267 to block any short-duration noise which is contained in the NMR imaging signal output at 275. A characteristic of this switch is that it does not generate appreciable energy at frequencies near the Larmor frequency when it is operated. Since the noise spikes are very short in duration and the blanking periods are correspondingly very short, it has been discovered that this method of removing noise spikes from the NMR signal does not produce objectional image artifacts. Indeed, as long as the blanking period is less than one sample period of the A/D converter 209, the image artifacts are negligible, even when it occurs during the acquisition of a view in central k-space. The blanking period should be as short as possible while still of sufficient duration to cover the noise spike. Thus, because of its simplicity and cost effectiveness, blanking out the noise is preferred over the other corrective methods such as interpolation or adding the inverse of the noise to the NMR signal.

Figure 4:
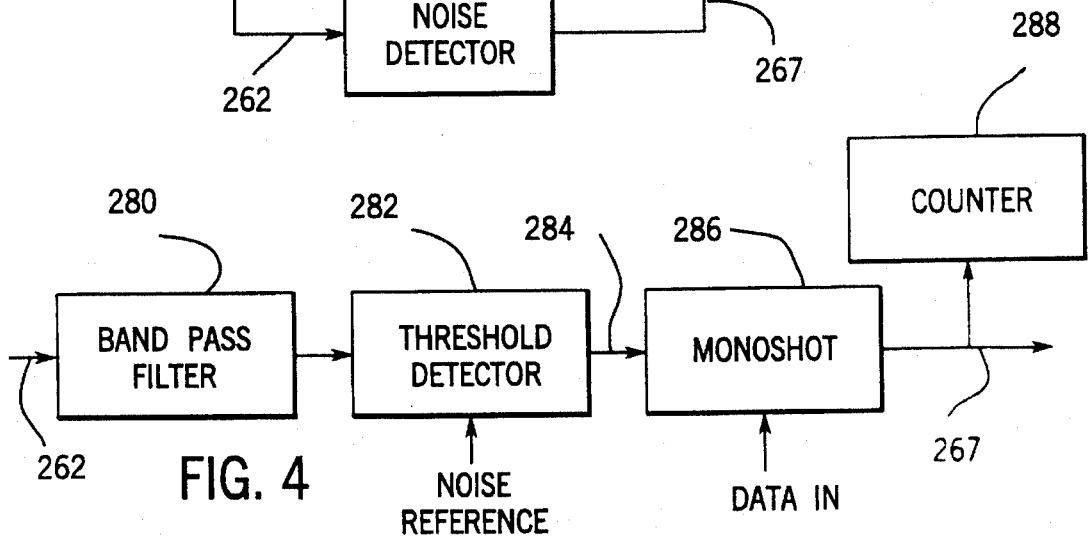
FIG. 4 is an electrical block diagram of a noise detector which forms part of the noise filter of FIG. 3.

Referring particularly to FIGS. 3 and 4, the noise detector 263 includes a bandpass filter 280 which receives the NMR signal on line 262. The NMR signal includes the desired imaging signals within the imaging bandwidth as well as the undesired noise signals both within and outside the imaging bandwidth. The bandpass filter 280 produces a filtered NMR signal which is applied to a threshold detector 282. The bandpass filter 280 is designed to pass a large band of frequencies outside the band of imaging frequencies. In the preferred embodiment, a notch filter is used for this purpose and it is tuned to filter out the one megaHertz band of image frequencies centered on the Larmor frequency. This produces two pass bands to the detector 282, one below the imaging frequencies, and the other above the imaging frequencies. Since a typical short-duration noise spike has a spectral bandwidth ranging from DC to one-thousand megaHertz, the filtered NMR signal will contain the vast majority of this noise signal while blocking the one megahertz band of imaging signals.

The magnitude of the filtered NMR signal is compared with the magnitude of a noise reference by the threshold detector 282. The noise reference is a function of the "noise floor" for the particular system, receiver coil, subject and NMR pulse sequence being used. The noise reference is set to a magnitude which is greater than the noise floor when no short-duration noise spikes are occurring. This level may be set manually during the set-up and calibration of the NMR system and altered automatically as a function of the receive coil and the pulse sequence selected by the operator. The threshold detector 282 is an operational amplifier operated as a comparator. One input is driven by a dc reference level and the other input is driven by the filtered NMR signal plus another dc reference signal. The second dc reference is adjusted to set the threshold level. The threshold detector 282 produces a noise indication signal on line 284 when the filtered NMR signal exceeds the noise reference. This noise indication signal is coupled to output 267 by a monostabile multi-vibrator, or "monoshot" 286. The monoshot 286 is enabled by the DATA IN signal that controls data acquisition and it produces a single output pulse having a fixed duration equal to that of the system's minimum sampling time. Because short-duration noise is known to be produced by a number of system transitions that occur when data is not acquired, the use of the DATA IN signal insures that only those noise events that occur during image data acquisition are registered. A counter 288 connects to the output 267 and stores the total number of registered noise events that have occurred. This number is periodically read by maintenance personnel and used to evaluate system performance.

There are numerous variations that can be made from the preferred embodiment without departing from the spirit of the invention. The noise detector 263 may be placed at other locations in the NMR signal path and its noise indication signal may be employed in other ways to ameliorate the effects of short-duration noise spikes. For example, the noise detector 263 can be connected between the RF receive coil and the pre-amp 153 or it may be located between the down converter 208 and A/D converter 209. Instead of using a fixed duration blanking pulse at monoshot 286, a blanking pulse whose duration is determined by detecting the noise spike envelope may be produced. Instead of blanking or correcting the NMR signal in its analog form, the noise indication signal may also be employed to correct the acquired NMR data in its digital form. This same noise indication signal may be used to "time stamp" the acquired NMR data so that it can be altered later in the image reconstruction process, or the noise indication signal may be used to alter the scan sequence. For example, if a noise spike is detected while acquiring a view from the central region of k-space, the view acquisition order may be altered to reacquire that view at a later time in the scan.

Other variations are possible. For example, circuitry may be added to protect amplifiers and other components from over voltage and over current conditions. Rather than being fixed, the noise reference level may be controlled by an automatic gain circuit which adjusts the level as a function of NMR noise power.

Rather than simply blanking out the noise spike, other signal correction methods are possible. For example, a negative impulse might be inserted into the NMR signal coincident with the noise spike to offset its effects, or a sample and hold circuit might be employed to apply the signal sample just prior to the noise spike during the detected noise spike interval. The NMR signal may be passed through a variable bandwidth, bandpass filter, and the noise indication signal employed to constrict the bandwidth to a fraction of the signal bandwidth. Yet another correction method is to capture the NMR signal carrier frequency prior to the noise spike with a phase locked loop, and to insert a signal of this frequency into the gap formed by the blocked noise spike.

We claim:

1. In an NMR system which acquires an NMR signal having a desired frequency bandwidth, the improvement comprising:

a filter connected to receive the NMR signal and tuned to pass a range of frequencies outside the desired frequency bandwidth;

a detector connected to receive the filtered output signal from the filter, compare its level with the level of a noise reference signal, and produce a noise indication signal when the level of the filtered NMR signal exceeds that of the noise reference signal; and means for receiving the NMR signal and modifying the NMR signal when the noise indication signal is produced.

2. The improvement as recited in claim 1 in which the filter passes a band of frequencies higher than the desired frequency bandwidth, and a band of frequencies lower than the desired frequency bandwidth.

3. The improvement as recited in claim 1 in which the means for receiving and modifying the NMR signal is a blanking circuit which suppresses the NMR signal during the interval in which the noise indication signal is produced.

4. The improvement as recited in claim 3 which includes a time delay connected to receive the NMR signal and impose a delay thereon prior to application to the blanking circuit.

5. The improvement as recited in claim 1 which includes a counter connected to the detector and being operable to count the number of noise indication signals which are produced.

* * * * *